United States Patent [19]

Banks et al.

[11] Patent Number: 5,098,527
[45] Date of Patent: Mar. 24, 1992

[54] METHOD OF MAKING ELECTRICALLY CONDUCTIVE PATTERNS

[75] Inventors: Christopher P. Banks, Saffron Walden; Edward Irving, Burwell, both of England

[73] Assignee: Ciba-Geigy Corporation, Ardsley, N.Y.

[21] Appl. No.: 408,860

[22] Filed: Sep. 18, 1989

[30] Foreign Application Priority Data

Sep. 21, 1988 [GB] United Kingdom ............... 8822145

[51] Int. Cl.$^5$ ............................................. G03F 7/11
[52] U.S. Cl. ............................... 205/198; 204/180.6; 204/181.1; 430/325; 205/221
[58] Field of Search ............... 204/38.1, 38.7, 37.1, 204/37.6, 180.2, 180.6, 181.1; 430/325

[56] References Cited

U.S. PATENT DOCUMENTS

| | | | |
|---|---|---|---|
| 3,440,047 | 4/1969 | Levinos et al. | 96/36.3 |
| 4,546,067 | 10/1985 | Irving et al. | 430/325 |
| 4,548,895 | 10/1985 | Irving et al. | 430/325 |
| 4,692,503 | 9/1987 | Das et al. | 526/301 |
| 4,746,399 | 5/1988 | Demmer et al. | 156/656 |
| 4,898,656 | 2/1990 | Hoshino et al. | 204/181.1 |
| 4,935,320 | 6/1990 | Rohde et al. | 430/14 |
| 4,943,516 | 7/1990 | Kamayachi et al. | 430/280 |
| 4,978,594 | 12/1990 | Bruce et al. | 430/14 |
| 4,985,344 | 1/1991 | Uchino et al. | 430/925 |

FOREIGN PATENT DOCUMENTS 204415 4/1986 European Pat. Off. .
3214807 10/1983 Fed. Rep. of Germany .
293312 2/1986 U.S.S.R. .

*Primary Examiner*—John Niebling
*Assistant Examiner*—William T. Leader
*Attorney, Agent, or Firm*—JoAnn Villamizar

[57] ABSTRACT

A method of making a pattern on an electrically conductive material such as a printed circuit comprises (i) electrodepositing on an electrically conductive surface a film of an organic polymer having, per average molecule, more than one reactive functional group, (ii) forming on the electrodeposited film a predetermined pattern of a heat-curable resist having, per average molecule, more than one group reactive with the reactive groups in the electrodeposited film on heating, thereby leaving predetermined areas of the electrodeposited film uncovered, (iii) removing the uncovered areas of the electrodeposited film by treatment with a solvent therefor, thereby forming a surface comprising bare conductive material in predetermined areas and, in other predetermined areas, conductive material coated by areas of the electrodeposited film covered by the resist, and (iv) heating to complete adhesion of the resist to the electrically conductive surface through the areas of the electrodeposited film covered by the resist, steps (iii) and (iv) being carried out in either order.

20 Claims, No Drawings

METHOD OF MAKING ELECTRICALLY CONDUCTIVE PATTERNS

The present invention relates to a method of making a pattern of an electrically conductive material, particularly metallic patterns such as printed circuits and the like.

It is known, in the production of printed circuits, to form on an electrically conductive surface, usually the copper surface of a copper-clad laminate, a predetermined pattern of a resist using screen printing or photoimaging techniques. This gives a laminate having bare copper in some areas and copper coated by the resist in remaining areas. Depending on the type of printed circuit, the laminate may be subjected to various subsequent procedures. For example, solder may be applied directly to the bare copper areas of the laminate by immersing the laminate in a solder bath, the resist acting as a solder mask. In another procedure, the bare copper areas of the laminate are plated with a tin-lead alloy, the resist is then removed, the copper exposed by removal of the resist is etched using an etchant which does not remove the tin-lead alloy, and the alloy is then removed using a tin-lead alloy stripper, to leave a copper pattern on the laminate base. This copper pattern can be further processed by forming thereon a further resist in a predetermined pattern to act as a solder mask, and immersing the laminate in a solder bath to apply solder to the bare copper areas not covered by the solder mask.

Both of the abovementioned procedures involve the application of solder by immersing a substrate having a predetermined pattern of a solder mask resist into a solder bath at high temperatures e.g. 200°–500° C. The solder mask resist is therefore required to form a heat-resistant bond to the areas of the substrate to which solder is not to be applied. There is a continuing need for methods of improving the formation of heat-resistant bonds between solder mask resists and the conductive surfaces to which they are applied.

It has now been found that heat-resistant bonds between solder mask resists and conductive substrates can be formed in the production of patterns on conductive material by using a solder mask resist having reactive functional groups and, before application of the resist, electrodepositing on the conductive substrate a film of an organic polymer having functional groups reactive with the functional groups in the resist. After formation of the resist pattern and before or after removal of areas of the electrodeposited film not covered by the resist, the substrate can be heated to effect heat-resistant adhesion of the resist to the areas of the substrate underlying the resist through the electrodeposited polymer film between the resist and the substrate.

The electrodeposition of a polymer film on bare metal areas of a substrate surface having bare metal in predetermined areas and metal coated by a resist in remaining areas, followed by removal of the resist, etching of the metal thereby exposed and removal of the electrodeposited polymer with a suitable solvent to leave a metal pattern is described in Russian Patent 293 312 and U.S. Pat. No. 4,746,399. Neither of those publications suggests the formation on the substrate, after the etching process, of a pattern of a resist having groups reactive with groups in the electrodeposited polymer film.

Accordingly, the present invention provides a method of making a pattern on an electrically conductive material which comprises
  (i) electrodepositing on an electrically conductive surface a film of an organic polymer having, per average molecule, more than one reactive functional group,
  (ii) forming on the electrodeposited film a predetermined pattern of a heat-curable resist having, per average molecule, more than one group reactive with the reactive groups in the electrodeposited film on heating, thereby leaving predetermined areas of the electrodeposited film uncovered,
  (iii) removing the uncovered areas of the electrodeposited film by treatment with a solvent therefor, thereby forming a surface comprising bare conductive material in predetermined areas and, in other predetermined areas, conductive material coated by areas of the electrodeposited film covered by the resist, and
  (iv) heating to complete adhesion of the resist to the electrically conductive surface through the areas of the electrodeposited film covered by the resist,
steps (iii) and (iv) being carried out in either order.

Polymers which on electrodeposition form films having reactive functional groups are well known. Such polymers include polymers of ethylenically unsaturated materials such as acrylic homopolymers and copolymers and copolymers of styrenes with maleic anhydride; adducts of epoxide resins such as diglycidyl ethers of dihydric alcohols or bisphenols with amines such as diethanolamine, polycarboxylic acids or their anhydrides such as glutaric acid or succinic anhydride, or aminocarboxylic acids such as aminobenzoic acids; and reaction products of phenolic hydroxyl group-containing resins with an aldehyde and an amine or an aminocarboxylic acid, for example a reaction product of a phenol-terminated adduct of a diglycidyl ether with a bisphenol with formaldehyde and diethanolamine or sarcosine, such polymers having, per average molecule, more than one reactive functional group, usually epoxide, hydroxyl, carboxyl or blocked isocyanate groups.

The electrodeposited organic polymer is preferably an acrylic polymer which may be, for example, a homopolymer of an acrylic acid. Preferred acrylic polymers include copolymers of at least one monoacrylic monomer containing a carboxyl group and at least one monoacrylic ester, optionally together with at least one other vinyl monomer. Suitable carboxyl-containing monoacrylic monomers from which the copolymers may be derived include acrylic acid, methacrylic acid and adducts of a hydroxyalkyl acrylate or methacrylate with a polycarboxylic acid anhydride. Acrylic and methacrylic acids are particularly preferred carboxyl-containing acrylic monomers.

Suitable monoacrylic esters from which the copolymers may be derived include methyl acrylate, ethyl acrylate, n-butyl acrylate, n-hexyl acrylate, 2-ethylhexyl acrylate and the corresponding methacrylates. Preferably, at least one monoacrylic ester contains a reactive functional group such as an epoxide group or, preferably, a hydroxyl or blocked isocyanate group. Suitable monoacrylic esters having such reactive groups include 2-hydroxyethyl acrylate, 2-hydroxypropyl acrylate, 3-hydroxypropyl acrylate and the corresponding methacrylates, reaction products of 2-isocyanatoethyl acrylate or 2-isocyanatoethyl methacrylate with an isocyanate-blocking agent, for example as described in U.S. Pat. No. 3,542,739, or reaction products of a polyisocyanate, preferably a tolylene diisocyanate, with a hydroxyalkyl acrylate or methacrylate such as those hereinbefore described and an isocyanate-blocking agent, for example as described in U.S. Pat. No. 4,113,958. Isocyanate-blocking agents are well known and include alcohols, phenols, mercaptans, primary and secondary amines, oximes, triazoles, pyrazoles and lactams. Preferred such blocking agents are oximes and lactams. Particularly preferred reactive group-containing monoacrylic esters are 2-hydroxyethyl methacrylate and a product obtained by reacting tolylene-2,4-diisocyanate (1 mol) first with 2-hydroxyethyl methacrylate (1 mol) then with epsilon-caprolactam (1 mol).

The optional vinyl monomer which may be copolymerised with the carboxyl-containing monoacrylic monomer and the monoacrylic ester may be, for example, a vinyl ester such as vinyl acetate, a vinyl halide such as vinyl chloride or, preferably, a styrene, such as alphamethyl styrene, p-chlorostyrene or, in particularly preferred embodiments, styrene itself.

Other preferred acrylic polymers include copolymers of at least one monoacrylic monomer containing a tertiary amine group and at least one monoacrylic ester having a reactive functional group, optionally together with at least one other vinyl monomer. Suitable monoacrylic monomers containing a tertiary amine group from which the copolymers may be derived include dialkylaminoalkyl acrylates and dialkylaminoalkyl methacrylates, preferably 2-(dimethylamino)ethyl acrylate, 2-(diethylamino)ethyl acrylate, 2-(dimethylamino)propyl acrylate and the corresponding methacrylates, 2-(dimethylamino)ethyl methacrylate being especially preferred.

Reactive group-containing monoacrylic esters copolymerised with the tertiary amine-containing monoacrylic monomer may be acrylates or methacrylates containing an epoxide group or, preferably, a hydroxyl or blocked isocyanate group as hereinbefore described for the reactive group-containing monoacrylic esters copolymerised with the carboxyl-containing monoacrylic monomer.

The optional vinyl monomer which may be copolymerised with the tertiary amine group-containing monoacrylic monomer and the reactive group-containing monoacrylic ester may be, for example, an alkyl acrylate or methacrylate, such as methyl acrylate, ethyl acrylate, n-butyl acrylate, n-hexyl acrylate, 2-ethylhexyl acrylate and the corresponding methacrylates, a vinyl ester such as vinyl acetate, a vinyl halide such as vinyl chloride or a styrene such as styrene, alphamethyl styrene or p-chlorostyrene. Amongst these, the alkyl acrylates and methacrylates and styrene are preferred.

Particularly preferred acrylic polymers for use in the method of the invention are copolymers of (a) acrylic acid, methacrylic acid or 2-(dimethylamino)ethyl methacrylate with (b) a hydroxyalkyl acrylate or methacrylate or a blocked isocyanate group-containing acrylate or methacrylate and, optionally, (c) at least one further vinyl monomer, preferably selected from alkyl acrylates, alkyl methacrylates, styrene and mixtures of two or more thereof. The especially preferred acrylates and methacrylates (b) and the alkyl acrylates and methacrylates for (c) are as hereinbefore described.

The acrylic polymers may be prepared by conventional polymerisation processes using free radical polymerisation initiators such as peroxides or azo compounds, usually to give polymers having a number average molecular weight of 5000 or more, preferably 5000 to 50,000. Thus the monomers may be heated with the initiator in solution in an organic solvent, preferably a solvent which is miscible with the medium from which the polymer is to be electrodeposited. Conventional chain transfer agents such as tert.dodecyl mercaptan can be used when desired.

Electrodeposition of the organic polymer may be carried out using conventional procedures. Thus the electrodepositable polymer optionally together with conventional additives such as pigments, dyes, fillers and plasticizers, can be dissolved or dispersed in an aqueous medium, which may contain a minor amount of an organic solvent, together with an acid or base to at least partially neutralise salt-forming groups on the polymer. The aqueous electrodeposition medium generally contains from 2 to 60%, preferably from 5 to 25%, by weight of the polymer. The conductive surface on which the polymer film is to be electrodeposited can be immersed in the electrodeposition medium as an anode or cathode, depending on whether the polymer is anodically or cathodically depositable, another electrode of opposite charge (a counter electrode) immersed in the medium and a current passed between the electrodes to electrodeposit the polymer on the required electrode.

Electrodeposition for only a few minutes, usually one minute, at a voltage of up to 200 volts is sufficient in most cases. Voltages as low as 2 volts may be used in some cases, especially if the size of the electrode on which the polymer film is deposited is small in relation to the other electrode. For example, a cathodically depositable polymer may be deposited on a small cathode in a tank where the whole of the tank is the anode, at voltages of 2 volts or 5 volts. Adhesion of the polymer film may be improved if it is deposited in two steps, first at a low voltage and then at a higher voltage. For example, a good coating can be obtained by electrodepositing the polymer at 2 volts for 2 minutes, followed by deposition at 5 volts for up to 5 minutes. The electrodeposited polymer film is usually dried, for example by heating at a temperature of up to 110° C., before further processing. If desired, this film may be heated to higher temperatures, for example up to 150° C., to increase the solvent resistance thereof prior to step (ii).

Step (ii) of the method of the invention, the formation of the predetermined pattern of heat-curable resist on the electrodeposited polymer film, may be carried out by photocuring on the electrodeposited polymer film in a predetermined pattern a photocurable resist having groups reactive with the reactive groups in the electrodeposited polymer film on heating. In this embodiment of the invention, step (iv) of the process is usually carried out after step (iii).

The reactive group-containing resist preferably has photocurable acrylate or methacrylate groups or alpha, beta-ethylenically unsaturated ester or ketone groups having aromaticity or ethylenic unsaturation in conjugation with the alpha, beta unsaturation, for example cinnamate, sorbate, chalcone, phenyl-substituted propeneone and phenyl-substituted pentadienone groups. The resist preferably has epoxy, carboxyl or hydroxyl groups reactive on heating with the reactive functional groups in the electrodeposited polymer film. Such resists are known and many different types are available commercially.

Materials containing epoxy and conjugated alpha, beta-ethylenically unsaturated ester or ketone groups suitable for use as the resist are described in U.S. Pat. No. 4,546,067. Materials containing epoxy and acrylate or methacrylate groups are described in U.S. Pat. No. 4,548,895. Photocurable compositions containing resins having carboxyl groups and acrylate or methacrylate groups suitable for use as the resist are described in British Patent Specification 1 474 715. Photocurable compositions containing resins having carboxyl groups and conjugated alpha, beta-ethylenically unsaturated ketone groups are described in U.S. Pat. No. 4,079,183. Resists having acrylate groups and carboxyl groups which can be developed in aqueous media are available from Du Pont under the RISTON trade mark. Photocurable hydroxyl group-containing adducts of epoxy resins and acrylic or methacrylic acid suitable for use as resists are well known and widely available from various commercial sources. As will be readily understood by those skilled in the art of photocuring, materials containing acrylate or methacrylate groups to be photocured are generally used together with free radical-generating photoinitiators; these photoinitiators are usually incorporated in commercially available acrylic resists.

The reactive group-containing resist may include conventional photosensitisers and other additives used in conventional photoresists such as dyes and non-photosensitive film-forming polymers.

The predetermined pattern of heat-curable resist photocured in step (ii) may be formed by applying the resist directly in a predetermined pattern using a screen printing technique. Preferably, the predetermined pattern of heat-curable resist is formed by applying a layer of the photocurable resist over the electrodeposited film, irradiating the photocurable resist with actinic radiation in a predetermined pattern to photocure the layer in exposed areas and removing unexposed areas of the layer.

Irradiation of the photocurable resist layer in a predetermined pattern may be achieved by exposure through an image-bearing transparency consisting of substantially opaque and substantially transparent areas, or by means of a computer-controlled laser beam. Electromagnetic radiation having a wavelength of 200–600 nm is generally used, and suitable sources include carbon arcs, mercury vapour arcs, fluorescent lamps with phosphors emitting ultra violet light, argon and xenon glow lamps, tungsten lamps, and photographic flood lamps; of these, mercury vapour arcs and metal halide lamps are the most suitable. The exposure time required depends on such factors as the nature of the components of, and the thickness of, the photocurable resist layer, the type of radiation source, and its distance from the solder mask. Suitable exposure times can readily be found by routine experimentation.

Removal of the unexposed areas of the irradiated layer is preferably effected by treatment with a solvent. This solvent is chosen according to the nature of the photocurable resist, and may be water, an aqueous or aqueous organic solution of an acid or base or an organic solvent or mixture of solvents. Suitable acid solutions include those of acetic, lactic, glycolic or toluene-p-sulphonic acids, while suitable basic solutions include those of sodium or potassium hydroxide or carbonate. Suitable organic solvents include hydrocarbons such as toluene and xylene, halohydrocarbons such as 1,1,1-trichloroethane and dichloromethane, hydroxylic solvents such as ethanol, 2-n-butoxyethanol, 2-ethoxyethanol, and diethylene glycol monobutyl ether (butyl digol), esters such as 2-ethoxyethyl acetate and propylene carbonate, ketones such as cyclohexanone, acetone and methyl ethyl ketone, ethers such as tetrahydrofuran and lactones such as butyrolactone.

The solvent can be chosen so that the removal of the unexposed areas of the photocurable resist layer also effects step (iii) of the method of the invention, i.e. the removal of the uncovered areas of the electrodeposited polymer film.

The formation of the predetermined pattern of heat-curable resist on the electrodeposited polymer film in step (ii) of the method of the invention may also be effected by applying a heat-curable, reactive group-containing resist to the electrodeposited polymer film directly in a predetermined pattern by screen printing. In this embodiment, the resist is usually cured by heating before uncovered areas of the electrodeposited polymer film are removed by treatment with a solvent therefor, i.e. step (iii) as hereinbefore defined is usually carried out after step (iv).

Reactive group-containing, heat-curable resists suitable for use in this embodiment of the invention preferably contain resins having epoxy, carboxyl or hydroxyl groups reactive on heating with the reactive groups in the electrodeposited polymer film. Such resins include hydroxyl- or carboxyl-containing resins having acrylate or methacrylate groups, such as those hereinbefore described, together with thermally activated free radical initiators therefor, phenolic resins such as phenol-formaldehyde resins and, preferably, epoxide resins.

Preferred epoxide resins are polyglycidyl ethers of polyhydric phenols, including bisphenols such as bisphenol A, bisphenol F and tetrabromobisphenol A, and novolak resins such as phenol-formaldehyde and cresol-formaldehyde novolak resins, and mixtures thereof. Especially preferred epoxide resins are diglycidyl ethers, which may have been advanced, of bisphenol A, polyglycidyl ethers of phenol-formaldehyde novolak resins, and mixtures thereof. Although a resist containing an epoxide resin may be cured on heating by interaction of the epoxide groups with reactive groups in the electrodeposited polymer film, the resist preferably contains a heat-activatable curing agent for the epoxide resin, for example dicyandiamide, an imidazole or an aromatic polyamine, optionally together with an accelerator conventionally used with such curing agents.

The solvent used to remove uncovered areas of the electrodeposited film in step (iii) can be selected from the same group of solvents hereinbefore specified for removal of unexposed areas of an irradiated photocurable resist layer. A suitable solvent can be found by routine experimentation.

The heating step (iv) is usually carried out at a temperature of 100°–180° C., depending on the nature of the electrodeposited polymer and the heat-curable resist. Using the particularly preferred polymers and resists hereinbefore specified, this heating is preferably carried out at 120°–150° C. Heating at these temperatures for periods of up to one hour is usually sufficient to give heat-resistant adhesion of the resist to the electrically conductive surface through the intermediate electrodeposited film such as would be necessary, for example, for subsequent immersion in solder baths at conventional temperatures. The heating step (iv) may be prolonged to give particularly high heat-resistant adhesion as required.

The method of the invention is particularly suitable for the production of metallic patterns starting from a substrate having a surface comprising bare metal in predetermined areas and metal coated by a preformed resist in remaining areas, the bare metal surface being the electrically conductive surface hereinbefore specified in the definition of step (i) of the method of the invention. In this embodiment of the invention, between steps (i) and (ii) the preformed resist may be removed from said remaining areas using a solvent which does not remove the electrodeposited polymer film and metal thereby exposed in said remaining areas is etched using an etchant which does not remove the electrodeposited polymer film.

The preformed resist present as a coating on the initial substrate may be an epoxide resin applied by a screen printing process and then cured. Preferably, the preformed resist is a photoresist coated in selected areas by applying it uniformly to the substrate, which is usually a copper-clad laminate, subjecting it to actinic radiation in a predetermined pattern and then removing exposed or unexposed areas according to whether the photoresist is positive or negative respectively. Positive and negative photoresists for use in making printed circuit boards are well known materials and any of them may be used. They can be removable under aqueous conditions or by means of an organic solvent. Another layer of copper or a layer of another metal such as nickel may be deposited on bare copper areas before electrodeposition in step (ii).

It is possible to use a combination of a preformed photoresist and an electrodepositable polymer which are both removable under acidic aqueous conditions or both removable under basic aqueous conditions provided that the photoresist is removable under milder conditions than are needed to remove the electrodeposited polymer, e.g. a more dilute solution of acid or base. It is also possible to use a preformed resist and an electrodepositable polymer which are removable by different organic solvents. It is particularly preferred that the preformed resist and the electrodepositable polymer are chosen so that the preformed resist is removed using an aqueous solvent and the electrodepositable polymer film is removed in step (iii) using an organic solvent.

Metal exposed by removal of the preformed resist, usually copper, may be removed by any well known etchant such as ferric chloride, hydrogen peroxide/phosphoric acid, ammonium persulphate, or cupric chloride. After etching, the substrate has a surface comprising predetermined areas of metal covered by the electrodeposited polymer film and predetermined areas from which the metal has been removed by the etching process. Where the initial substrate is a copper-clad plastics laminate, after the etching the surface comprises predetermined areas of copper covered by the electrodeposited polymer film and areas in which the laminate base is devoid of copper.

The method of the invention is particularly suitable for the production of printed circuits, including multi-layer printed circuits having plated through holes or vias. The heat-curable resist formed in a predetermined pattern on the electrodeposited polymer film in step (ii) may act as a solder mask during subsequent processing of the printed circuit.

The invention is illustrated by the following Examples, in which parts are by weight unless otherwise indicated.

Polymers used in the Examples are prepared as follows.

Polymer Solution I

A monomer mixture consisting of styrene (60 parts), 2-ethylhexyl acrylate (27.5 parts), 2-hydroxyethyl methacrylate (7.5 parts) and dimethylaminoethyl methacrylate (5 parts) with azobis(isobutyronitrile) (1.5 parts) is added dropwise over 2 hours to 2-n-butoxyethanol (50 parts) stirred at 120° C. The reaction mixture is maintained at 120° C. for a further hour and a further charge of azobis(isobutyronitrile) (0.5 part) and 2-n-butoxyethanol (5.5 parts) added. This procedure—maintenance at 120° C. for one hour followed by addition of the further charge—is repeated twice more and the reaction mixture held at 120° C. for a further hour and then cooled. The copolymer in the resulting solution has a number average molecular weight of 10,279, the solution having an amine content of 0.19 equiv./kg.

Polymer Solution II

A monomer mixture consisting of methyl methacrylate (20 parts), n-butyl acrylate (22.5 parts), 2-hydroxyethyl methacrylate (5 parts) and methacrylic acid (2.5 parts) with tert.dodecyl mercaptan (0.015 part) and azobis(isobutyronitrile) (0.75 part) is added dropwise over 2 hours to 2-n-butoxyethanol (50 parts) stirred at 100° C. The reaction mixture is maintained at 100° C. for a further hour and a further charge of azobis(isobutyronitrile) (0.25 part) is added. The mixture is held at 100° C. for a further 3 hours and then evaporated under reduced pressure for 30 minutes before cooling. The copolymer in the resulting solution has a number average molecular weight of 10,048, the solution having a carboxyl content of 0.30 equiv/kg.

Polymer Solution III

A monomer mixture of styrene (47.5 parts), 2-ethylhexyl acrylate (25 parts), 2-hydroxyethyl methacrylate (16 parts), dimethylaminoethyl methacrylate (7.5 parts), and a blocked isocyanate-containing methacrylate (4 parts, prepared by reacting technical tolylene-2,4-diisocyanate (1 mol) first with 2-hydroxyethyl methacrylate (1 mol) then with epsilon-caprolactam (1 mol)), with azobis(isobutryonitrile) (1.5 parts) and 2-n-butoxyethanol (50 parts) is heated at 100° C. for 3 hours. A further charge of azobis(isobutyronitrile) (0.5 part) and 2-butoxyethanol (5.5 parts) is added and the reaction maintained at 100° C. for a further hour. This procedure—addition of the further charge followed by maintenance at 100° C. for one hour—is repeated twice more and then the reaction mixture is cooled. The copolymer in the resulting solution has a number average molecular weight of 7,097, the solution having an amine content of 0.28 equiv/kg.

The RISTON photoresists used in the Examples are acrylic photoresists available from Du Pont (UK) Ltd., Riston Division, Wedgewood Way, Stevenage, Hertfordshire SG1 4QN, England.

EXAMPLE 1

A copper-clad laminate coated with RISTON 3415, an aqueous developable negative photoresist, which has been imaged and developed to form a pattern in the photoresist, thereby leaving areas where copper is exposed, is used as a cathode in an electrodeposition bath equipped with a stainless steel anode. The bath contains a solution of Polymer Solution I (100 parts) and aqueous 20% lactic acid (6.7 parts) in water (493 parts). A voltage of 70 volts is applied for one minute and the laminate is then removed from the bath, rinsed with water and dried at 110° C. for 5 minutes. The electrodeposited polymer film coats the areas where the copper is exposed. The dried laminate is immersed in a bath of an aqueous 7% solution of ethanolamine at 50° C. This treatment removes the photoresist leaving the electrodeposited polymer film. The copper exposed by removing the photoresist is etched away by immersion in an etching bath containing a solution of concentrated sulphuric acid (20 parts) and ammonium persulphate (150 parts) in water (830 parts) at 50° C. The etched laminate is rinsed in water and dried to leave a clear pattern, in copper covered with the electrodeposited polymer film, on the laminate base.

A layer of a liquid solder mask photoresist containing a photocurable resin containing epoxide groups, prepared by advancing 1,5-bis(4-glycidyloxyphenyl)penta-1,4-dien-3-one with bisphenol A and tetrabromobisphenol A, having a molecular weight of 3000-3500 and an epoxide content of 0.8-1.0 equiv./kg, (10 parts), and dicyandiamide (1 part) as epoxide curing agent is applied over the surface bearing the copper pattern using a wire-wound rod. The solder mask layer is dried at 80° C. for 10 minutes and then irradiated through an image-bearing transparency using a 5 kW metal halide lamp at a distance of 75 cm for 2 minutes. The irradiated laminate is immersed in a mixture of propylene carbonate (50 parts), gamma-butyrolactone (20 parts) and butyl digol (30 parts) to remove the areas of the solder mask not exposed in the imagewise irradiation and also remove the electrodeposited polymer film thus exposed. The resulting laminate is baked at 130° C. for 30 minutes to form a heat-resistant bond between the exposed, photocured solder mask and the underlying copper pattern through the intermediate electrodeposited polymer film.

EXAMPLE 2

A copper-clad laminate coated with RISTON 3415 negative photoresist, which has been imaged and developed to form a pattern in the photoresist, thereby leaving areas where copper is exposed, is used as the anode in an electrodeposition bath equipped with a stainless steel cathode. The bath contains a solution of Polymer Solution II (100 parts) and aqueous 20% potassium hydroxide (5 parts) in water (395 parts).

A voltage of 40 volts is applied for one minute and the laminate is then removed from the bath, rinsed with water and dried at 110° C. for 5 minutes. The electrodeposited polymer film coats the areas where the copper is exposed. The dried laminate is then immersed in 7% ethanolamine as described in Example 1 and treated subsequently as described in Example 1 to give a laminate having a pattern of photocured solder mask with heat-resistant adhesion to the underlying copper pattern through the intermediate electrodeposited polymer film.

EXAMPLE 3

A copper-clad laminate coated with RISTON 3415 negative photoresist, which has been imaged and developed to form a pattern in the photoresist, thereby leaving areas where copper is exposed, is used as the cathode in an electrodeposition bath equipped with a stainless steel anode. The bath contains a solution of Polymer Solution III (100 parts) and aqueous 20% lactic acid (10 parts) in water (490 parts).

A voltage of 40 volts is applied for one minute and the laminate is then removed from the bath, rinsed with water and dried at 110° C. for 5 minutes. The electrodeposited polymer film coats the areas where the copper is exposed. The dried laminate is heated at 130° C. for 30 minutes to increase the solvent resistance thereof. It is then immersed in an aqueous 7% solution of ethanolamine at 50° C. to remove the photoresist, leaving the electrodeposited polymer film. The copper exposed by removing the photoresist is etched away by immersion in an etching bath as described in Example 1. The etched laminate is rinsed in water and dried to leave a clear pattern, in copper covered with the electrodeposited polymer film, on the laminate base.

A layer of RISTON T215R, a solder mask resist containing carboxyl groups and photocurable acrylate groups, is applied over the surface bearing the copper pattern using a dry film laminator. The solder mask is irradiated through an image-bearing transparency using a 5 Kw metal halide lamp at a distance of 75 cm for 15 seconds. The irradiated laminate is immersed in a solution of sodium carbonate (0.5 part) and 2-n-butoxyethanol (4 parts) in water (95.5 parts) to remove the areas of the solder mask not exposed in the imagewise irradiation. The electrodeposited film thereby exposed is removed by immersing the laminate in 1,1,1-trichloroethane. The resulting laminate is baked at 150° C. for 20 minutes to form a heat-resistant bond between the exposed, photocured solder mask and the underlying copper pattern through the intermediate electrodeposited polymer film.

EXAMPLE 4

The procedure of Example 3 is repeated to the stage of formation of a clear pattern, in copper covered with the electrodeposited polymer film, on the laminate base.

A layer of RISTON 3415, a solder mask photoresist containing carboxyl groups and photocurable acrylate groups, is applied over the surface bearing the copper pattern using a dry film laminator. The solder mask is irradiated through an image-bearing transparency using a 5 kW metal halide lamp at a distance of 75 cm for 15 seconds. The irradiated laminate is immersed in an aqueous 1% solution of sodium carbonate to remove the areas of the solder mask not exposed in the imagewise irradiation. The electrodeposited film thus exposed is removed by immersing the laminate in 1,1,1-trichloroethane. The resulting laminate is baked at 150° C. for 20 minutes to form a heat-resistant bond between the exposed photocured solder mask and the underlying copper pattern through the intermediate electrodeposited polymer film.

EXAMPLE 5

The procedure of Example 1 is repeated to the stage of formation of a clear pattern, in copper covered with the electrodeposited polymer film, on the laminate base. A pattern of heat-curable solder mask resist comprising a polyglycidyl ether of a phenol-formaldehyde novolak having an epoxide content of 5.7 equivs/kg (10 parts), 4,4'-diaminodiphenylmethane (5.7 parts) and cyclohexanone (5 parts) is applied by screen printing onto selected areas of the copper covered with the electrodeposited film on the laminate base. The laminate is heated at 150° C. for one hour to cure the solder mask and form a heat-resistant bond between the solder mask and the underlying copper pattern through the intermediate electrodeposited film. Areas of the electrodeposited polymer film not coated by the solder mask during screen printing are then removed by immersing the laminate in 1,1,1-trichloroethane.

We claim:

1. A method of making a pattern on an electrically conductive material which comprises
   (i) electrodepositing on an electrically conductive surface a film of an organic polymer having, per average molecule, more than one reactive functional group,
   (ii) forming on the electrodeposited film a predetermined pattern of a heat-curable resist having, per average molecule, more than one group reactive with the reactive groups in the electrodeposited film on heating, thereby leaving predetermined areas of the electrodeposited film uncovered,
   (iii) removing the uncovered areas of the electrodeposited film by treatment with a solvent therefor, thereby forming a surface comprising bare conductive material in predetermined areas and, in other predetermined areas, conductive material coated by areas of the electrodeposited film covered by the resist, and
   (iv) heating to complete adhesion of the resist to the electrically conductive surface through the areas of the electrodeposited film covered by the resist,
   steps (iii) and (iv) being carried out in either order.

2. A method according to claim 1, in which said organic polymer is a polymer of an ethylenically unsaturated material; an adduct of an epoxide resin with an amine, a polycarboxylic acid or anhydride thereof or an aminocarboxylic acid; or a reaction product of a phenolic hydroxyl group-containing resin with an aldehyde and an amine or an aminocarboxylic acid; said polymer having, per average molecule, more than one reactive functional group.

3. A method according to claim 2, in which said organic polymer is an acrylic polymer.

4. A method according to claim 3, in which said organic polymer is a copolymer of at least two vinyl monomers, at least one of said monomers being a monoacrylic monomer containing a carboxyl group and at least one of said monomers being a monoacrylic ester.

5. A method according to claim 4, in which said monoacrylic ester contains a reactive functional group.

6. A method according to claim 5, in which said functional group is a hydroxyl or blocked isocyanate group.

7. A method according to claim 3, in which said polymer is a copolymer of at least two vinyl monomers, at least one of said monomers being a monoacrylic monomer containing a tertiary amine group and at least one of said monomers being a monoacrylic ester having a reactive functional group.

8. A method according to claim 7, in which said functional group is a hydroxyl or blocked isocyanate group.

9. A method according to claim 3, in which said polymer is a copolymer of (a) acrylic acid, methacrylic acid or 2-dimethylaminoethyl methacrylate with (b) a hydroxyalkyl acrylate or methacrylate or a blocked isocyanate group-containing acrylate or methacrylate, or a copolymer of (a) and (b) with (c) at least one further vinyl monomer.

10. A method according to claim 9, in which said vinyl monomer (c) is selected from alkyl acrylates, alkyl methacrylates, styrene or mixtures of two or more thereof.

11. A method according to claim 1, in which the predetermined pattern of a heat-curable resist is formed by photocuring in a predetermined pattern a photocurable resist having groups reactive with the reactive groups in the electrodeposited film on heating and step (iv) is carried out after step (iii).

12. A method according to claim 11, in which the resist has photocurable alpha, beta-ethylenically unsaturated ester or ketone groups having aromaticity or ethylenic unsaturation in conjugation with the alpha, beta unsaturation or has photocurable acrylate or methacrylate groups.

13. A method according to claim 11, in which the resist has epoxy, carboxyl or hydroxyl groups reactive on heating with the reactive functional groups in the electrodeposited film.

14. A method according to claim 11, in which the predetermined pattern of heat-curable resist is formed by applying a layer of the photocurable resist over the electrodeposited film, irradiating the photocurable resist with actinic radiation in a predetermined pattern to photocure the layer in exposed areas, and removing unexposed areas of the layer.

15. A method according to claim 14, in which said unexposed areas are removed by treatment with a solvent, said treatment also effecting step (iii) removal of the uncovered areas of the electrodeposited film.

16. A method according to claim 1, in which the predetermined pattern of heat-curable resist is formed by applying said resist directly in a predetermined pattern by screen printing and step (iii) is carried out after step (iv).

17. A method according to claim 1, in which the electrically conductive surface is a bare metal surface in predetermined areas of a substrate having a surface comprising bare metal in predetermined areas and metal coated by a preformed resist in remaining areas.

18. A method according to claim 17, in which between steps (i) and (ii) said preformed resist is removed from said remaining areas using a solvent which does not remove the electrodeposited film and metal thereby exposed in said remaining areas is etched using an etchant which does not remove the electrodeposited film.

19. A method according to claim 18, in which the preformed resist is removed using an aqueous solvent and the electrodeposited film is removed using an organic solvent in step (iii).

20. A method according to claim 1, in which the electrically conductive pattern is a printed circuit.

* * * * *